(12) United States Patent
Bernstein et al.

(10) Patent No.: US 6,917,221 B2
(45) Date of Patent: Jul. 12, 2005

(54) METHOD AND APPARATUS FOR ENHANCING THE SOFT ERROR RATE IMMUNITY OF DYNAMIC LOGIC CIRCUITS

(75) Inventors: Kerry Bernstein, Underhill, VT (US); Stephen V. Kosonocky, Wilton, CT (US); Randy W. Mann, Poughquag, NY (US); Jeffrey H. Oppold, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 267 days.

(21) Appl. No.: 10/249,642

(22) Filed: Apr. 28, 2003

(65) Prior Publication Data

US 2004/0216015 A1 Oct. 28, 2004

(51) Int. Cl.[7] ............................................. H03K 19/094
(52) U.S. Cl. .............................. 326/88; 326/15; 326/95; 326/98; 327/208
(58) Field of Search ..................... 326/15, 88, 93–98; 327/208–212, 214, 215, 224, 225

(56) References Cited

U.S. PATENT DOCUMENTS

| | | |
|---|---|---|
| 3,835,457 A | 9/1974 | Yu |
| 4,316,106 A | 2/1982 | Young et al. |
| 4,535,465 A | 8/1985 | Leach |
| 4,567,386 A | 1/1986 | Benschop |
| 4,622,479 A * | 11/1986 | Taylor ........................ 326/88 |
| 4,633,105 A | 12/1986 | Tsujimoto |
| 4,678,941 A | 7/1987 | Chao et al. |
| 4,689,505 A | 8/1987 | Ghoshal |
| 5,073,731 A | 12/1991 | Oh |
| 5,898,333 A | 4/1999 | Kuo et al. |
| 5,973,514 A | 10/1999 | Kuo et al. |
| 6,072,355 A | 6/2000 | Bledsoe |
| 6,288,572 B1 | 9/2001 | Nowka |
| 6,492,839 B2 * | 12/2002 | Wang et al. .................. 326/98 |
| 6,563,345 B2 * | 5/2003 | Forbes ........................ 326/98 |
| 6,801,056 B2 * | 10/2004 | Forbes ........................ 326/95 |
| 6,838,911 B2 * | 1/2005 | Forbes ........................ 326/98 |

OTHER PUBLICATIONS

IBM Technical Disclosure Bulletin, "Dynamic Logic Driver", G.B. Long, R.C. Mitchell, and S.C. Pi, vol. 17, No. 7, Dec. 1974, pp. 1989–1990.

* cited by examiner

Primary Examiner—Vibol Tan
(74) Attorney, Agent, or Firm—Richard A. Henkler; Hoffman, Warnick & D'Alessandro LLC

(57) ABSTRACT

An apparatus and method for selectively enhancing the soft error rate (SER) immunity of a dynamic logic circuit. The apparatus includes a bootstrap capacitor coupled to a precharge input signal and a dynamic node of the dynamic logic circuit, and a device, such as an FET, for selectively connecting the bootstrap capacitor to the dynamic node.

20 Claims, 2 Drawing Sheets

METHOD AND APPARATUS FOR ENHANCING THE SOFT ERROR RATE IMMUNITY OF DYNAMIC LOGIC CIRCUITS

BACKGROUND OF INVENTION

1. Technical Field

The present invention relates generally to integrated circuits, and more particularly, to a method and apparatus for enhancing the soft error rate immunity of dynamic logic circuits.

2. Related Art

A dynamic complementary metal oxide semiconductor (CMOS) logic gate includes a logic structure having a precharge or output node, hereafter referred to as a "dynamic node," that is precharged to the supply voltage using a clocked p-channel device (e.g., a precharge PFET). The dynamic node is conditionally discharged (evaluated) to external ground (GND) through a clocked n-channel device (e.g., an evaluate NFET) by a set of devices forming the logic structure.

The clocked p-channel device has its gate coupled to an input precharge signal (PC). The dynamic node is "precharged" through a p-channel device to the supply voltage when PC is low. When PC goes high, the dynamic node is conditionally discharged (evaluated) through the clocked n-channel device to GND. The dynamic node is discharged if the input signals to the devices forming the logic structure (e.g., an AND or OR logic structure) have configured a conducting path to GND, otherwise the dynamic node stays charged high.

The amount of charge on a dynamic node of a dynamic logic gate is sensitive to soft errors caused by natural radiation sources, such as alpha particles and cosmic rays. For example, the charge on a dynamic node may be reduced below the charge threshold (Qcrit) necessary to alter the state of the node from high (logic 1) to low (logic 0) as charge is "knocked off" the dynamic node as a result of the circuit's interaction with an alpha particle. This is especially problematic for dynamic nodes having a low Qcrit.

Qcrit will continue to decrease as feature size and power requirements are scaled downward as a result of advances in CMOS process technology. As a result, soft error rates (SER) are likely to increase. Accordingly, there is a need in the art for a method and apparatus for enhancing the soft error rate immunity of dynamic logic circuits.

One technique that has been used to increase the SER robustness of a dynamic logic circuit involves increasing the capacitance on the dynamic node. This increases Qcrit because the charge Q on the dynamic node is proportional to capacitance (i.e., Q=C*V). Unfortunately, by increasing the capacitance, the speed of the dynamic logic circuit is often reduced. Accordingly, there is a need in the art for an apparatus for enhancing the SER immunity of dynamic logic circuits by increasing the capacitance on the dynamic node, which is capable of being selectively deactivated to increase the performance (e.g., speed) of the dynamic logic circuit.

SUMMARY OF INVENTION

The present invention provides a method and apparatus for enhancing the soft error rate (SER) immunity of dynamic logic circuits. The invention utilizes a bootstrap capacitor tied between the dynamic node of a dynamic logic circuit and an input precharge signal to increase the Qcrit on the dynamic node. An FET, coupled between the bootstrap capacitor and the dynamic node of the dynamic logic circuit, allows the bootstrap capacitor to be selectively connected to the dynamic node.

A first aspect of the present invention is directed to an apparatus for enhancing soft error rate (SER) immunity of a dynamic logic circuit, comprising a bootstrap capacitor coupled to a precharge (PC) input signal and a dynamic node the dynamic logic circuit and a device for selectively connecting the bootstrap capacitor to the dynamic node.

A second aspect of the present invention is directed to a method for enhancing soft error rate (SER) immunity of a dynamic logic circuit, comprising coupling a bootstrap capacitor to a precharge input signal and a dynamic node of the dynamic logic circuit, and selectively connecting the bootstrap capacitor to the dynamic node.

A third aspect of the present invention is directed to an integrated circuit including an apparatus for enhancing soft error rate (SER) immunity, the apparatus comprising a bootstrap capacitor coupled to a precharge input signal and a dynamic node of a dynamic logic circuit, and a device for selectively connecting the bootstrap capacitor to the dynamic node.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein.

DETAILED DESCRIPTION

Figure 1:
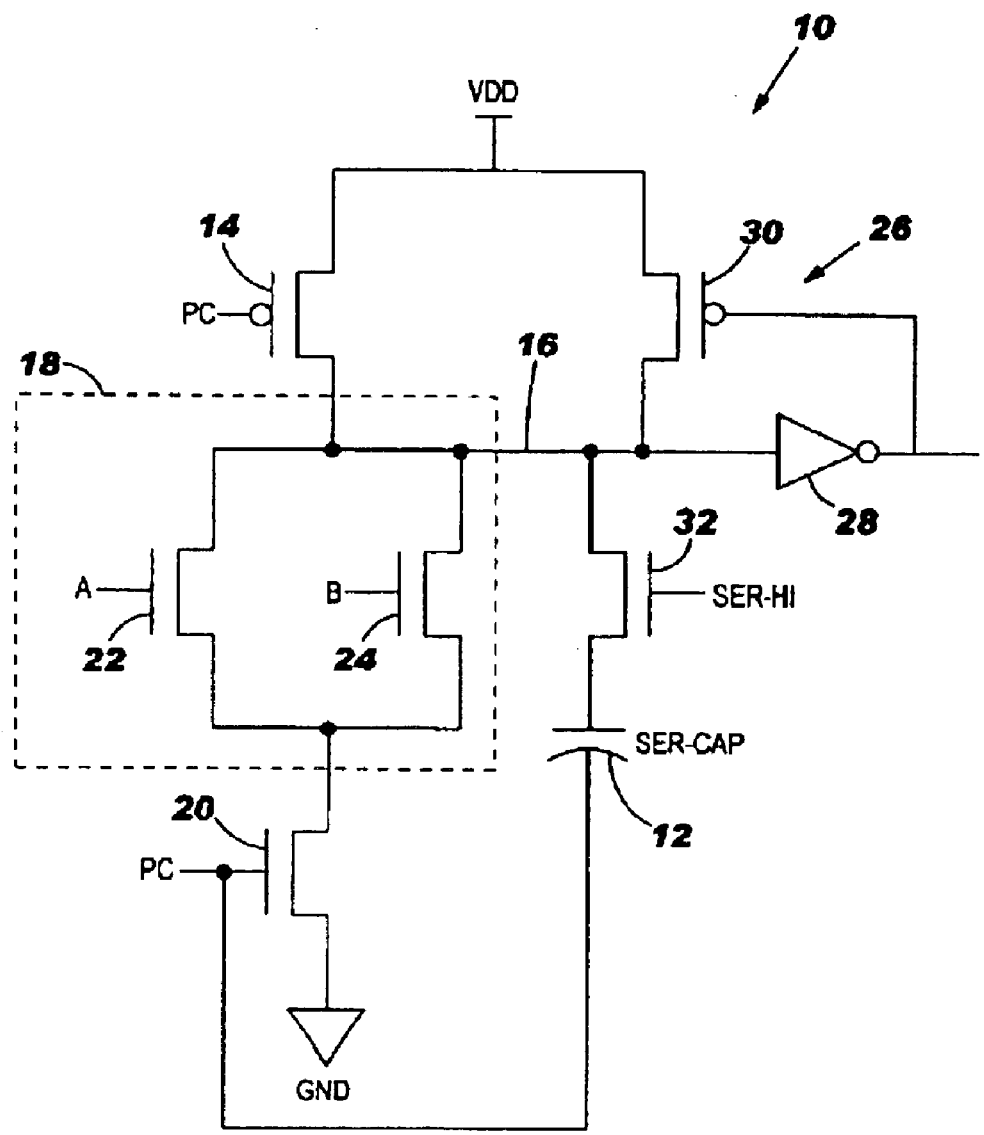
FIG. 1 illustrates a dynamic logic OR gate including a bootstrap capacitor arrangement in accordance with the present invention.

A dynamic logic OR gate 10 including a bootstrap capacitor 12 in accordance with the present invention is illustrated in FIG. 1. The OR gate 10 includes a precharge PFET 14 coupled between VDD and a dynamic node 16 of the gate. A logic structure 18 is coupled between the dynamic node 16 of the OR gate 10 and an evaluate NFET 20 that is tied to ground (GND). A precharge signal (PC) is applied to the gates of the precharge PFET 14 and the evaluate NFET 20. In this example, the logic structure 18 comprises a pair of NFETS 22, 24, arranged in parallel to provide an OR logic function. An input "A" is applied to the gate of NFET 22, while an input "B" is applied to the gate of NFET 24. Although shown as including only two NFETS 22, 24, it should be clear that the logic structure 18 could include more than two NFETS arranged in parallel. In addition, it should be clear that the logic structure 18 may alternately provide an AND logic function (e.g., NFETS 22, 24, arranged in series) or other known logic function, and may include any number of NFETS.

When the PC signal is low during a precharge phase, the evaluate NFET 20 is turned off and the precharge PFET 14 is turned on. As such, the dynamic node 16 is pulled high (i.e., precharged) to VDD. A keeper circuit 26 of a type known in the art is provided to keep the dynamic node 16 pulled high (unless the dynamic node 16 is pulled down to ground through the logic structure 18 during an evaluate stage). In this embodiment, the keeper circuit 26 comprises an inverter 28 and a PFET 30 that is coupled between VDD and the dynamic node 16. In operation, when the dynamic node 16 is charged high, the inverter 28 outputs a low signal which turns on PFET 30, pulling the dynamic node 16 to VDD. The dynamic node 16 will remain high, therefore, until the logic structure 18 provides a path to GND through the evaluate NFET 20 (i.e., PC must also be high).

When the PC signal goes high during the evaluate stage, the evaluate NFET 20 is turned on and the precharge PFET 14 is turned off. The dynamic node 16 may be discharged to GND if either (or both) of the inputs A and B to NFETS 22, 24 within the logic structure 18 have configured a conducting path to GND. Otherwise, the dynamic node 16 stays charged high.

In accordance with the present invention, a bootstrap capacitor arrangement comprising a bootstrap capacitor 12 (hereafter "SER-CAP" 12) is provided to increase the Qcrit of the dynamic node 16 and, therefore, the SER immunity of the OR gate 10. In particular, as shown in FIG. 1, SER-CAP 12 is connected to the PC signal and is selectively coupled to the dynamic node 16 via NFET 32. A signal "SER-HI" is used to selectively gate the NFET 32 to connect SER-CAP 12 to the dynamic node 16. For higher performance and lower capacitance, SER-CAP 12 can be selectively disconnected from the dynamic node 16 by turning off NFET 32. For improved SER immunity, SER-CAP 12 can be selectively connected to the dynamic node 16 by turning on NFET 32 using SER-HI.

The PC signal grounds the source of SER-CAP 12 during precharge (i.e., PC is low). The drain of SER-CAP 12 is connected to the dynamic node 16. When the PC signal goes high (evaluate) and NFET 32 is turned on by SER-HI, the potential of SER-CAP 12 gets pushed up from underneath, and the dynamic node 16's potential rises, adding Qcrit. Due to the impedance of NFET 32, most of the SER improvement is provided by the extra charge and dynamic node 16 potential, rather than simply from the added capacitance of SER-CAP 12.

The present invention allows the SER immunity of a circuit (e.g., an integrated circuit such as a microprocessor) to be selectively/dynamically changed based on its intended use. For example, in many consumer desktop applications, the performance of a microprocessor is often more important than SER reliability. In these types of applications, therefore, the bootstrapped capacitors 12 within the microprocessor can be turned off to boost performance. In applications where reliability is more important than performance (e.g., in an air traffic controller computer), the bootstrapped capacitors 12 within the same microprocessor can be turned on to boost SER reliability. Using the present invention, the failures in time rate (FIT) of the microprocessor could be improved, for example, by 100% by turning on the bootstrapped capacitors 12, while the performance of the microprocessor could be improved, for example, by 20% by turning off the bootstrapped capacitors 12. These values are only exemplary of the performance/SER reliability tradeoff afforded by the present invention, and are not intended to be limiting. The exact values are application/circuit specific and may vary widely based on many factors.

Figure 2:
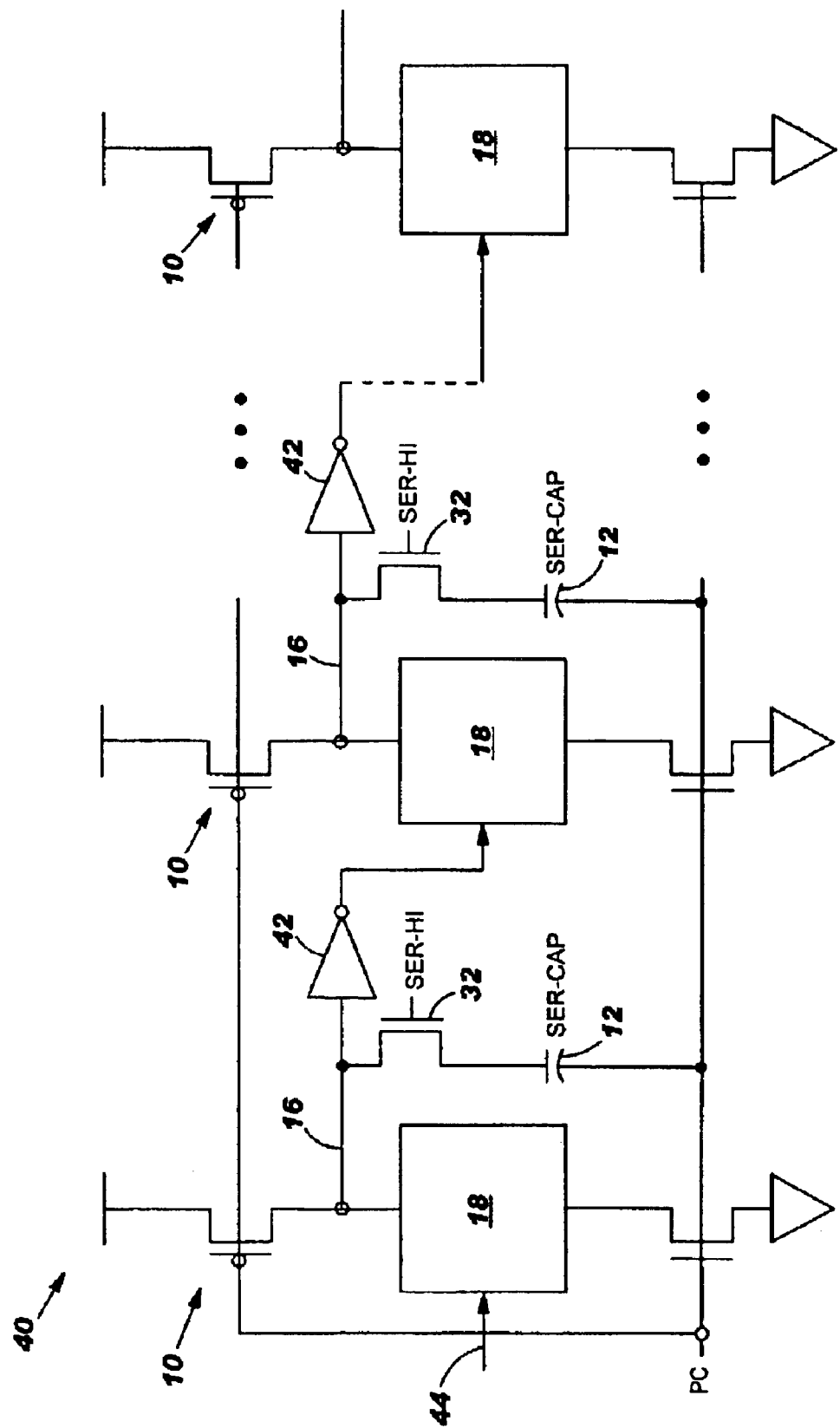
FIG. 2 shows a domino logic configuration in accordance with the present invention.

A domino logic configuration 40 is illustrated in FIG. 2. The domino logic configuration 40 typically comprises dynamic logic circuits 10 arranged in a plurality of domino stages. Each domino stage includes a logic structure 18 (e.g., an arrangement of AND or OR gates), with each domino stage separated by an inverting stage 42. In this arrangement, input signal(s) 44 applied to the logic structure 18 of the first domino stage, while the PC input signal is high, triggers operation of the remaining stages in sequence. This yields a domino-like signal propagation effect within the logic configuration 40.

In accordance with the present invention, a bootstrap capacitor arrangement, comprising a SER-CAP 12, and an NFET 32 for selectively connecting SER-CAP 12 to the dynamic node 16 of the corresponding logic structure 18, may be added to each stage of the domino logic configuration 40 to provide selective SER immunity enhancement.

As detailed above, the bootstrap capacitor arrangement of the present invention is configured to selectively increase Qcrit on the dynamic node 16 of a dynamic logic circuit 10. The results of circuit simulations showing the resultant increase in Qcrit are provided in Tables 1 and 2. These simulations were run at different temperatures and a constant VDD of 1.20 volts. Table 1 shows the results of the simulation with SER-HI (HIGH), while Table 2 shows the results of the simulation with SER-HI (LOW). By comparing Tables 1 and 2, it should be readily apparent that the bootstrap capacitor arrangement of the present invention significantly increases Qcrit on the dynamic node 16 of a dynamic logic circuit 10.

TABLE 1

(SER-HI (HIGH))

| Qcrit | Temp | Qcrit | Temp |
|---|---|---|---|
| 4.82 | 0 | 4.23 | 50 |
| 4.72 | 10 | 4.06 | 60 |
| 4.63 | 20 | 3.95 | 70 |
| 4.49 | 30 | 3.82 | 80 |
| 4.36 | 40 | 3.71 | 90 |

TABLE 2

(SER-HI (LOW))

| Qcrit | Temp | Qcrit | Temp |
|---|---|---|---|
| 2.66 | 0 | 2.38 | 50 |
| 2.59 | 10 | 2.32 | 60 |
| 2.52 | 20 | 2.25 | 70 |
| 2.43 | 30 | 2.19 | 80 |
| 2.44 | 40 | 2.13 | 90 |

What is claimed is:

1. An apparatus for enhancing soft error rate (SER) immunity of a dynamic logic circuit, comprising:
   a bootstrap capacitor coupled to a precharge input signal and a dynamic node of the dynamic logic circuit; and
   a device for selectively connecting the bootstrap capacitor to the dynamic node.

2. The apparatus according to claim 1, wherein the device for selectively connecting the bootstrap capacitor to the dynamic node comprises an FET.

3. The apparatus according to claim 2, further comprising a signal connected to a gate of the FET for selectively turning the FET on to connect the bootstrap capacitor to the dynamic node.

4. The apparatus according to claim 1, wherein the dynamic logic circuit comprises a precharge PFET coupled between a source voltage and the dynamic node, an evaluate NFET that is tied to ground, and a logic structure connected between the evaluate NFET and the dynamic node, and wherein the precharge input signal is applied to a gate of the precharge PFET and a gate of the evaluate NFET.

5. The apparatus according to claim 1, wherein the bootstrap capacitor increases Qcrit on the dynamic node.

6. The apparatus according to claim 1, wherein the bootstrap capacitor increases a potential on the dynamic node.

7. The apparatus according to claim 1, wherein the precharge input signal increases a potential on the bootstrap capacitor.

8. The apparatus according to claim 1, further comprising a domino logic configuration including a plurality of the dynamic logic circuits, wherein each dynamic logic circuit includes a bootstrap capacitor coupled to a precharge input signal and a dynamic node of the dynamic logic circuit, and a device for selectively connecting the bootstrap capacitor to the dynamic node.

9. A method for enhancing soft error rate (SER) immunity of a dynamic logic circuit, comprising:

coupling a bootstrap capacitor to a precharge input signal and a dynamic node of the dynamic logic circuit; and selectively connecting the bootstrap capacitor to the dynamic node.

10. The method according to claim 9, wherein the bootstrap capacitor is selectively connected to the dynamic node by a FET.

11. The method according to claim 10, further comprising: providing a signal to a gate of the FET for selectively turning the FET on to connect the bootstrap capacitor to the dynamic node.

12. The method according to claim 9, wherein the bootstrap capacitor increases Qcrit on the dynamic node.

13. The method according to claim 9, wherein the bootstrap capacitor increases a potential on the dynamic node.

14. The method according to claim 9, wherein the precharge input signal increases a potential on the bootstrap capacitor.

15. An integrated circuit including an apparatus for enhancing soft error rate (SER) immunity, the apparatus comprising:

a bootstrap capacitor coupled to a precharge input signal and a dynamic node of a dynamic logic circuit; and a device for selectively connecting the bootstrap capacitor to the dynamic node.

16. The integrated circuit according to claim 15, wherein the device for selectively connecting the bootstrap capacitor to the dynamic node comprises an FET.

17. The integrated circuit according to claim 16, further comprising a signal connected to a gate of the FET for selectively turning the FET on to connect the bootstrap capacitor to the dynamic node.

18. The integrated circuit according to claim 16, wherein the bootstrap capacitor increases Qcrit on the dynamic node.

19. The integrated circuit according to claim 16, wherein the bootstrap capacitor increases a potential on the dynamic node.

20. The integrated circuit according to claim 16, wherein the precharge input signal increases a potential on the bootstrap capacitor.

* * * * *